US007320938B2

(12) United States Patent
Purtell et al.

(10) Patent No.: US 7,320,938 B2
(45) Date of Patent: Jan. 22, 2008

(54) METHOD FOR REDUCING DENDRITE FORMATION IN NICKEL SILICON SALICIDE PROCESSES

(75) Inventors: Robert J. Purtell, West Jordan, UT (US); Yun-Yu Wang, Poughquag, NY (US); Keith Kwong Hon Wong, Wappingers Falls, NY (US)

(73) Assignee: Internatioanl Business Machines Corporation, Armonk, NY (US)

( * ) Notice: Subject to any disclaimer, the term of this patent is extended or adjusted under 35 U.S.C. 154(b) by 0 days.

(21) Appl. No.: 11/460,671

(22) Filed: Jul. 28, 2006

(65) Prior Publication Data

US 2007/0020929 A1    Jan. 25, 2007

Related U.S. Application Data

(63) Continuation of application No. 11/161,064, filed on Jul. 21, 2005, now Pat. No. 7,109,116.

(51) Int. Cl.
*H01L 21/44* (2006.01)
(52) U.S. Cl. ........................ 438/682; 438/664
(58) Field of Classification Search ........... 438/682, 438/664
See application file for complete search history.

(56) References Cited

U.S. PATENT DOCUMENTS

| 5,464,520 | A | 11/1995 | Kano et al. |
| 5,618,397 | A | 4/1997 | Kano et al. |
| 6,323,130 | B1 * | 11/2001 | Brodsky et al. ............ 438/682 |
| 6,780,694 | B2 | 8/2004 | Doris et al. |
| 6,787,425 | B1 | 9/2004 | Rotondaro et al. |
| 6,809,018 | B2 | 10/2004 | Chung |
| 2002/0111021 | A1 | 8/2002 | Paton et al. |
| 2004/0061191 | A1 | 4/2004 | Paton et al. |
| 2005/0272262 | A1 | 12/2005 | Kim |
| 2006/0003534 | A1 | 1/2006 | Roh et al. |

FOREIGN PATENT DOCUMENTS

JP    8067972 A1    3/1996

* cited by examiner

*Primary Examiner*—George R. Fourson
*Assistant Examiner*—John M. Parker
(74) *Attorney, Agent, or Firm*—Cantor Colburn LLP; Todd M. C. Li

(57) ABSTRACT

A method for reducing dendrite formation in a self-aligned, silicide process for a semiconductor device includes forming a silicide metal layer over a semiconductor substrate, the semiconductor device having one or more diffusion regions, one or more isolation areas and one or more gate structures formed thereon. The concentration of metal rich portions of the metal layer is reduced through the introduction of silicon thereto, and the semiconductor device is annealed.

7 Claims, 8 Drawing Sheets

METHOD FOR REDUCING DENDRITE FORMATION IN NICKEL SILICON SALICIDE PROCESSES

CROSS REFERENCE TO RELATED APPLICATIONS

This application is a continuation application of U.S. Ser. No. 11/161,064, filed Jul. 21, 2005, now U.S. Pat. No. 7,109,116, the contents of which are incorporated by reference herein in their entirety.

BACKGROUND

The present invention relates generally to semiconductor device processing techniques, and, more particularly, to a method for reducing dendrite formation in nickel silicide (NiSi) salicide processes.

In the manufacture of semiconductor devices, salicide (or self-aligned silicide) materials are formed upon gate conductors and diffusion regions to reduce the [contact/line] resistance of a CMOS device, thereby improving the speed characteristics thereof. In salicide technology, a refractory metal or a near noble metal, such as titanium for example, is deposited on a silicon substrate. The deposited metal is then annealed, thereby forming a metal silicide layer only on the exposed areas of the substrate. The areas of unreacted metal left on the dielectric may then be selectively etched away without a masking step. Thus, the process is "self-aligning."

As circuit devices have continued to shrink in size, however, it has been found that titanium silicide (TiSi$_2$) becomes an unsatisfactory silicide material since the sheet resistance thereof begins to sharply increase when the linewidth of the device decreases below 0.20 :m. More recently, materials such as cobalt disilicide (CoSi$_2$) and nickel silicide (NiSi) have been used as replacements for titanium in salicide structures since they generally do not suffer from a linewidth dependent sheet resistance problem. On the other hand, the use of cobalt silicide structures is not without its own drawbacks. For example, unlike titanium, a cobalt layer requires a cap layer such as titanium nitride (TiN) due to the sensitivity of cobalt to contaminants during the annealing process.

One difficulty associated with the NiSi salicide process is the formation of dendrites or "pipes" in the source/drain regions of a device though the conversion of the metal rich layer. The time and temperature window for the formation of NiSi is thus limited by the need for minimizing the reaction of metal over the insulator layers of the device that can subsequently form NiSi. In particular, if metal rich silicide regions remain after the initial anneal and etch steps, then subsequent thermal processing steps can result in the further conversion of nickel to NiSi (in the form of NiSi dendrites extending beyond the boundaries of the originally intended silicide regions). In turn, a growth of silicide material beneath spacers can result in adverse effects such as bit failures in an SRAM array, for example.

Presently, the problem of NiSi dendrite formation is addressed by simply reducing the time and temperature anneals, as well as the back end thermal budget. Unfortunately, for such an approach, the process window and resulting yield is unsatisfactory in view of this scheme for controlling silicide growth. Accordingly, it would be desirable to be able to control the formation of dendrites in the NiSi salicide process, but in a manner that maintains acceptable process window margins.

SUMMARY

The foregoing discussed drawbacks and deficiencies of the prior art are overcome or alleviated by a method for reducing dendrite formation in a self-aligned, silicide process for a semiconductor device. In an exemplary embodiment, the method includes forming a silicide metal layer over a semiconductor substrate, the semiconductor device having one or more diffusion regions, one or more isolation areas and one or more gate structures formed thereon. The concentration of metal rich portions of the metal layer is reduced through the introduction of silicon thereto, and the semiconductor device is annealed.

In another embodiment, a method for reducing dendrite formation in a self-aligned, silicide process for a semiconductor device includes forming a nickel layer over a semiconductor substrate, the semiconductor device having one or more diffusion regions, one or more isolation areas and one or more gate structures formed thereon. A nickel silicon layer is formed over the nickel layer, and a capping layer is formed over the nickel silicon layer. The semiconductor device is annealed so as to react the nickel layer with silicon in the diffusion regions and gate structures to create silicided contacts, the nickel layer further reacting with silicon present in the nickel silicon layer.

In still another embodiment, a method for reducing dendrite formation in a self-aligned, silicide process for a semiconductor device includes forming a nickel layer over a semiconductor substrate, the semiconductor device having one or more diffusion regions, one or more isolation areas and one or more gate structures formed thereon. A silicon layer is formed over the nickel layer, and a capping layer is formed over the silicon layer. The semiconductor device is annealed so as to react the nickel layer with silicon in the diffusion regions and gate structures to create silicided contacts, the nickel layer further reacting with the silicon layer.

BRIEF DESCRIPTION OF THE DRAWINGS

Referring to the exemplary drawings wherein like elements are numbered alike in the several Figures:

FIGS. 4(a) through 4(e) illustrate an exemplary process flow for controlling the formation of dendrites in the NiSi salicide process, in accordance with a third embodiment of the invention.

DETAILED DESCRIPTION

Disclosed herein is a method for reducing dendrite formation in nickel NiSi salicide processes. Briefly stated, the embodiments disclosed herein address the problem by reducing the concentration of metal rich nickel before the initial silicide annealing step during which it reacts to form NiSi. As described in further detail hereinafter, one way to implement the removal of metal rich nickel is to incorporate silicon into the initial deposition of nickel itself, such that this additional silicon is available for reacting with the nickel so as to reduce the concentration of metal rich Ni phases for subsequent time and temperature annealing steps. Thereby, a larger process window of NiSi formation without dendrites is enabled.

Alternatively, a layer of $Ni_xSi_y$ can be deposited over the initially deposited nickel layer to reduce the tendency for bridging by allowing the $Ni_xSi_y$ formed over the spacers by the deposition to be undercut when the Ni layer underneath is etched away. This deposition technique would further promote the formation of NiSi in the top layers, in addition to formation below by direct contact to the silicon. In still another embodiment, a thin silicon layer may be deposited over the initially deposited nickel layer, followed by an anneal to react the thin silicon layer with the metal rich phases still remaining in the resulting NiSi.

Figure 1A:
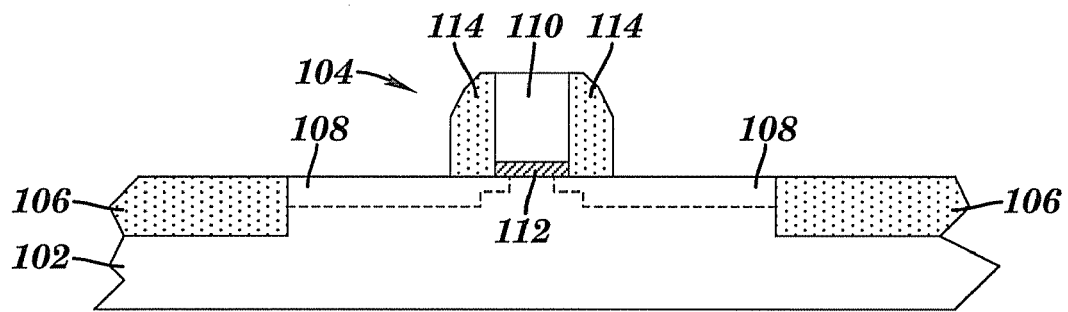
FIGS. 1(a) through 1(f) illustrate an existing process flow for NiSi salicide formation.
Figure 1B:
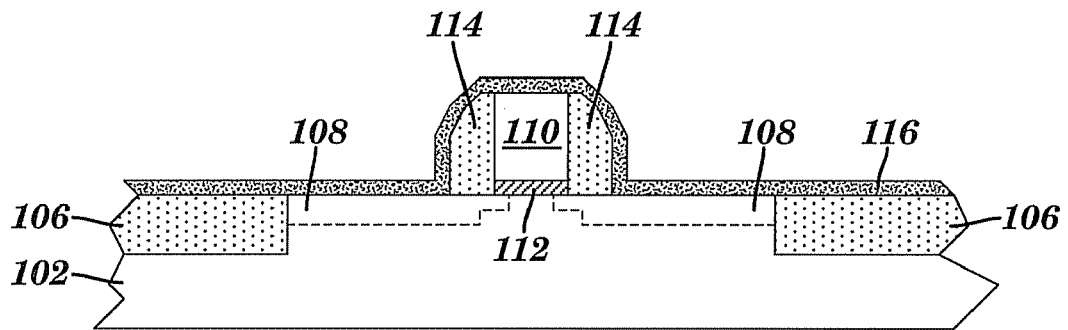
Figure 1C:
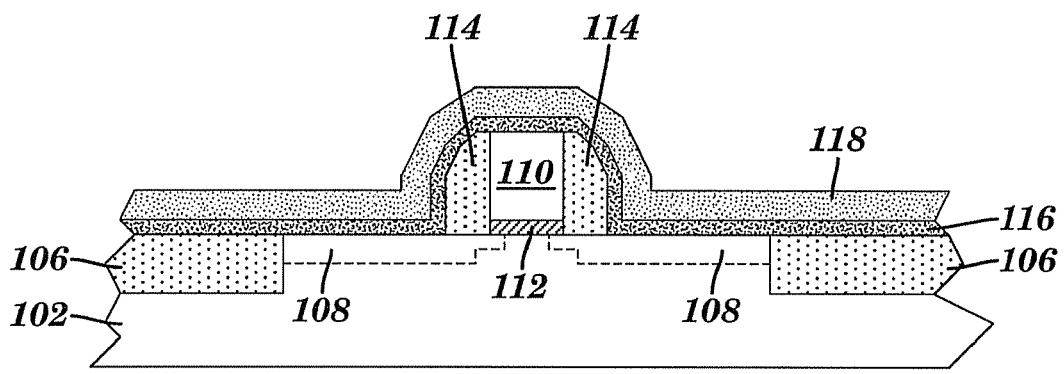

Referring initially to FIGS. 1(a) through 1(f), there is shown a series of process flow diagrams illustrating a conventional NiSi salicide formation process. In FIG. 1(a), a semiconductor substrate 102 is shown with a transistor device 104 (e.g., a MOSFET) formed between a pair of shallow trench isolations (STIs) 106. As will be recognized, the FET 104 includes doped source/drain diffusion regions 108, a gate conductor 110 (e.g., polysilicon) formed upon a thin gate dielectric 112 (e.g., oxide), and sidewall spacers 114 (e.g., oxide or nitride). Then, in FIG. 1(b), a thin silicide metal 116 (nickel in this example) is formed over the semiconductor device at an exemplary thickness of about 60 to about 100 angstroms, including the STIs 106, diffusion regions 108, spacers 114 and gate conductor 110. In order to protect against potential contaminants, a capping layer 118 (e.g., TiN) is then formed over the nickel layer 116, at an exemplary thickness of about 20 nanometers, as shown in FIG. 1(c).

Figure 1D:
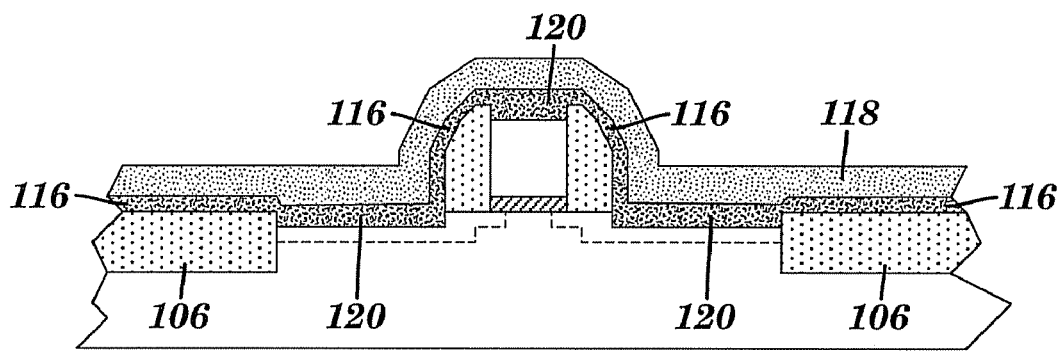
Figure 1E:
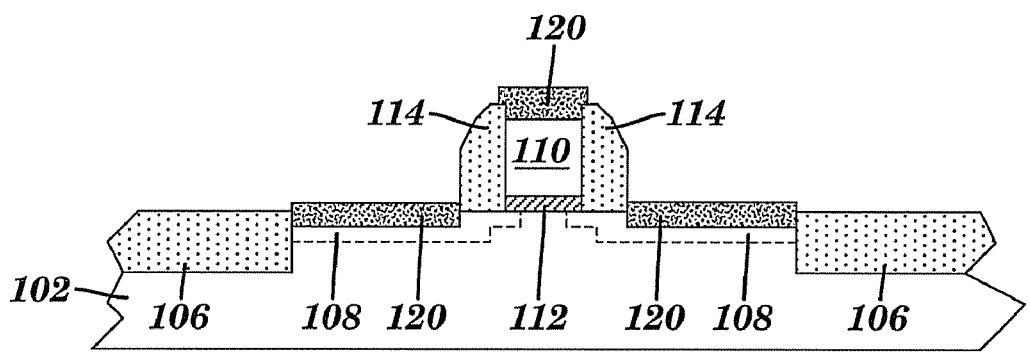

During an anneal of the device, the portions of the nickel layer 116 in contact with the regions upon which the nickel silicide contacts are to be formed (e.g., diffusions 108 and gate conductor 110) react with the silicon therein to form the self-aligned, NiSi regions indicated at 120 in FIG. 1(d). Elsewhere, the portions of the nickel layer 116 overlying insulating layers (e.g., STIs 106, spacers 114) do not react during the anneal. Thereafter, a selective etch process is used to remove the unreacted nickel layer 116, leaving the self-aligned nickel silicide contacts 120 shown in FIG. 1(e).

Figure 1F:
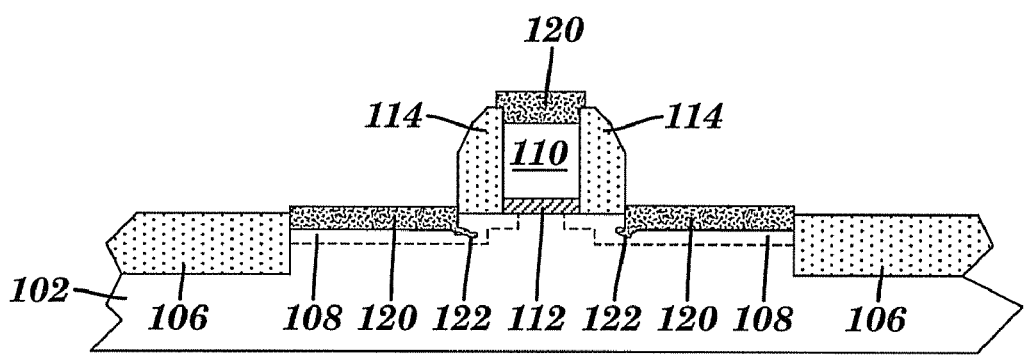

As indicated previously, however, metal rich portions of the original nickel layer formed over the salicide regions 120 may not be completely reacted with the silicon. In such instances, those portions will contribute to an initial increased sheet resistance. Furthermore, subsequent temperature processes (unrelated to silicidation) can cause the metal rich material to convert to NiSi in the form of dendrites 122 that extend beyond the boundaries of the desired silicide regions, as shown in FIG. 1(f). This additional silicide growth leads to the undesired device characteristics mentioned above.

Figure 2A:
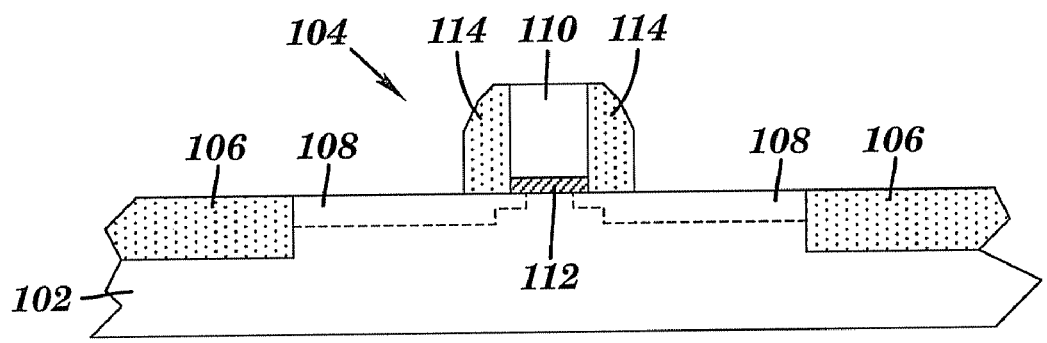
FIGS. 2(a) through 2(e) illustrate an exemplary process flow for controlling the formation of dendrites in the NiSi salicide process, in accordance with a first embodiment of the invention.
Figure 2B:
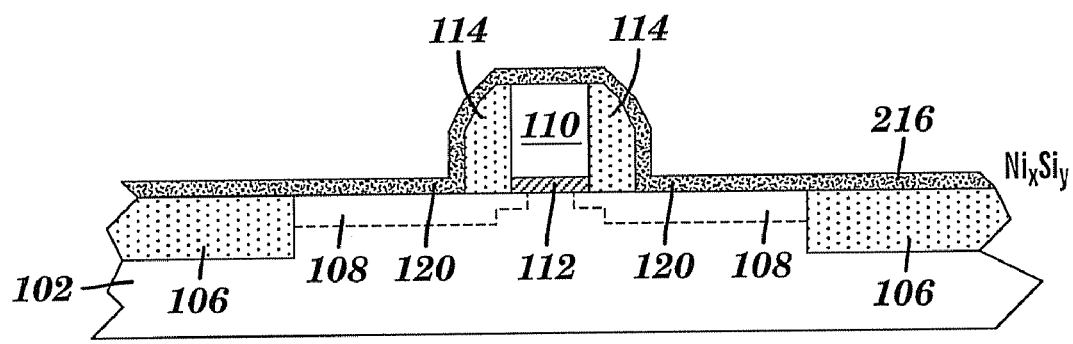
Figure 2C:
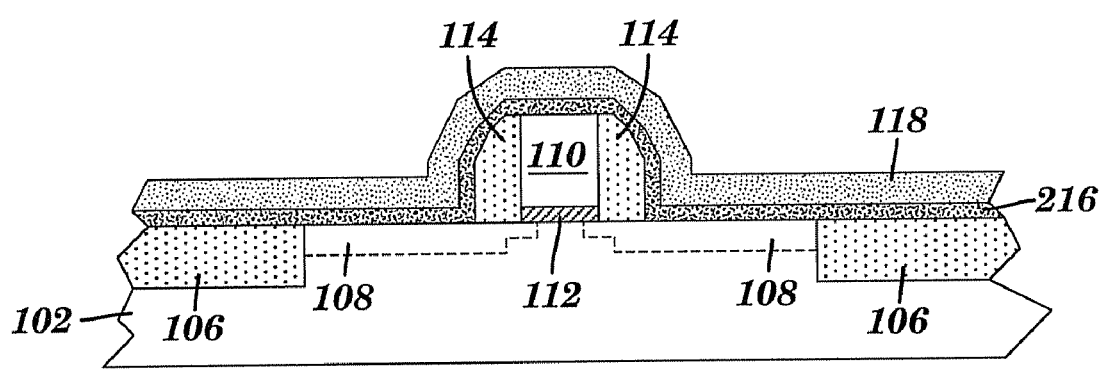
Figure 2D:
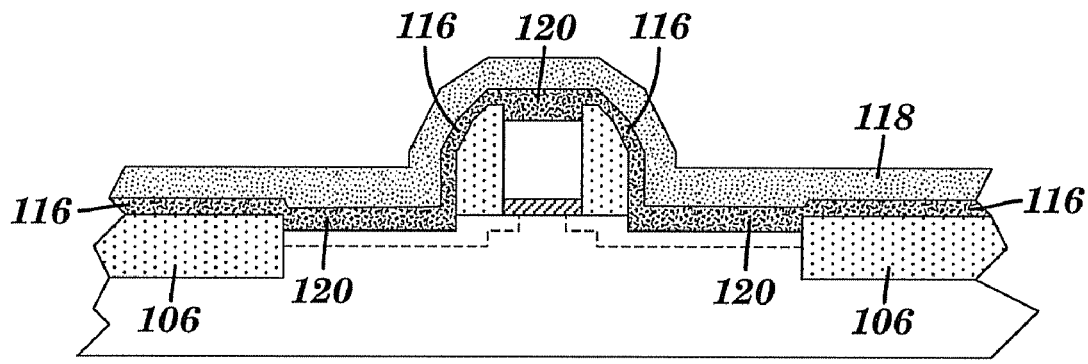
Figure 2E:
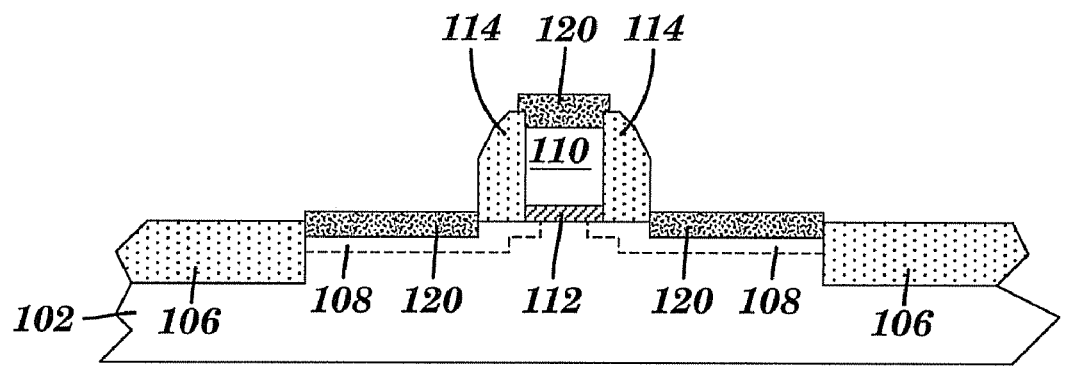

Accordingly, FIGS. 2(a) through 2(e) illustrate a first embodiment of a method for reducing dendrite formation in a nickel NiSi salicide process. For purposes of comparison, the exemplary FET structure of FIG. 1(a) is repeated in FIG. 2(a). In FIG. 2(b), a metal layer 216 is deposited over the semiconductor device. However, as opposed to pure nickel, silicon is also incorporated into the deposition process such that the composition of layer 216 is of the form $Ni_xSi_y$. In an exemplary embodiment, the composition of the $Ni_xSi_y$ layer includes about 5% to about 20% (atomic) silicon.

In order to compensate for the reduced nickel concentration in layer 216, the deposition thickness thereof may be increased by about the same percentage of silicon in the silicon nickel mixture. For example, if an existing process flow deposits about 100 angstroms of pure nickel as the silicide metal, then for a $Ni_xSi_y$ layer having about a 20% (atomic) silicon concentration, the thickness of layer 216 may be formed at about 120 angstroms. Thereafter, the cap layer 118 (e.g., TiN) is deposited in FIG. 2(c) as in the existing process flow, followed by the anneal in FIG. 2(d) and the etch of the unreacted metal in FIG. 2(e). Because of the reduced the concentration of metal rich nickel phases following the silicidation anneal, the silicided contacts 120 are now resistant to dendrite formation upon additional thermal treatments during subsequent processing steps (such as interlevel dielectric formation and metallization for example).

Figure 3A:
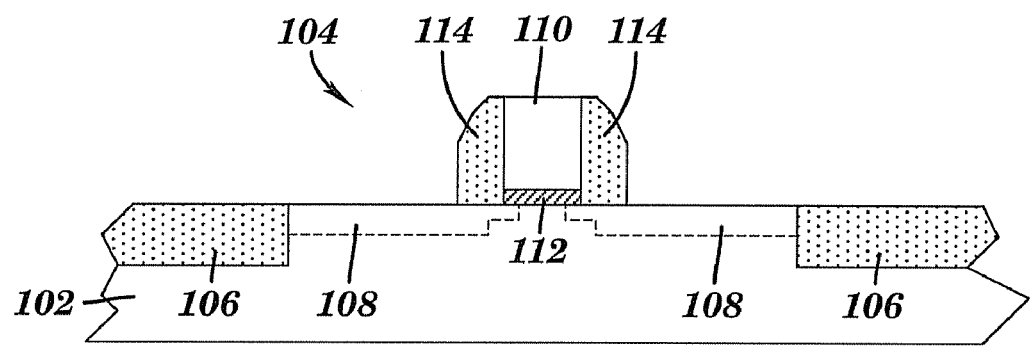
FIGS. 3(a) through 3(e) illustrate an exemplary process flow for controlling the formation of dendrites in the NiSi salicide process, in accordance with a second embodiment of the invention.
Figure 3B:
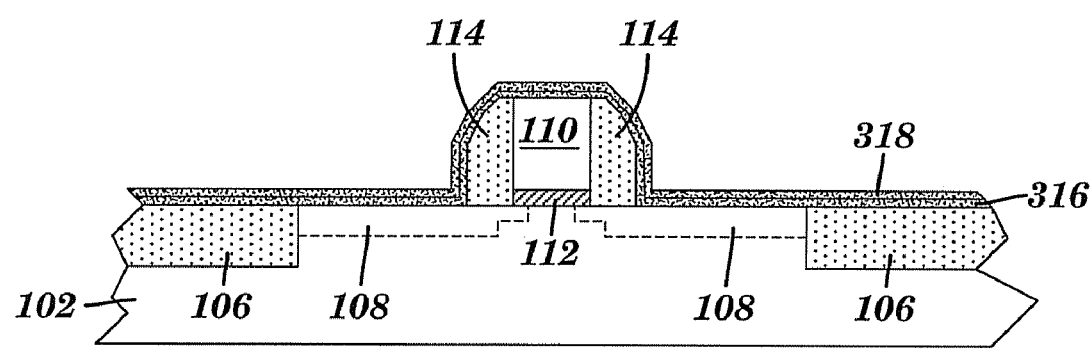
Figure 3C:
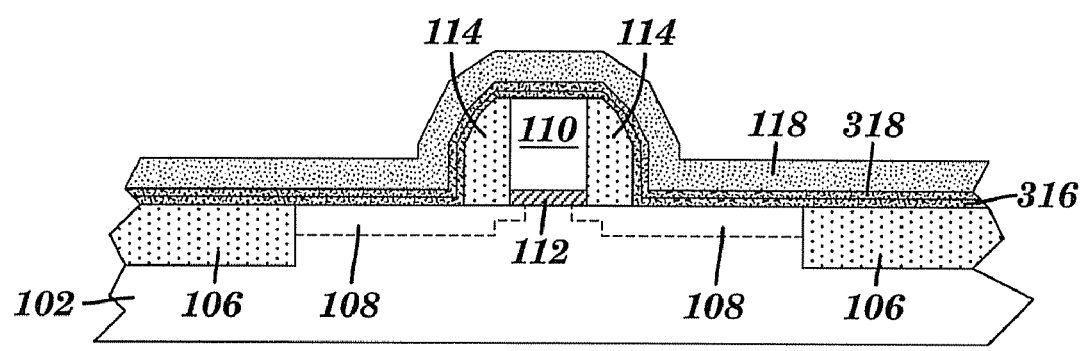

Referring now to FIGS. 3(a) through 3(e), there is shown a second embodiment of a method for reducing dendrite formation in a nickel salicide process. After the exemplary FET structure is formed in FIG. 3(a), a thin nickel layer 316 is deposited over the semiconductor device, followed by a thin nickel silicon mixture layer 318. In an exemplary embodiment, the total thickness of layers 316 and 318 may have about the same thickness a pure nickel layer used in a conventional salicide process (e.g., about 6 to about 10 nm). In FIG. 3(c), the cap layer 118 is formed over $Ni_xSi_y$ layer 318, followed by an anneal.

Figure 3D:
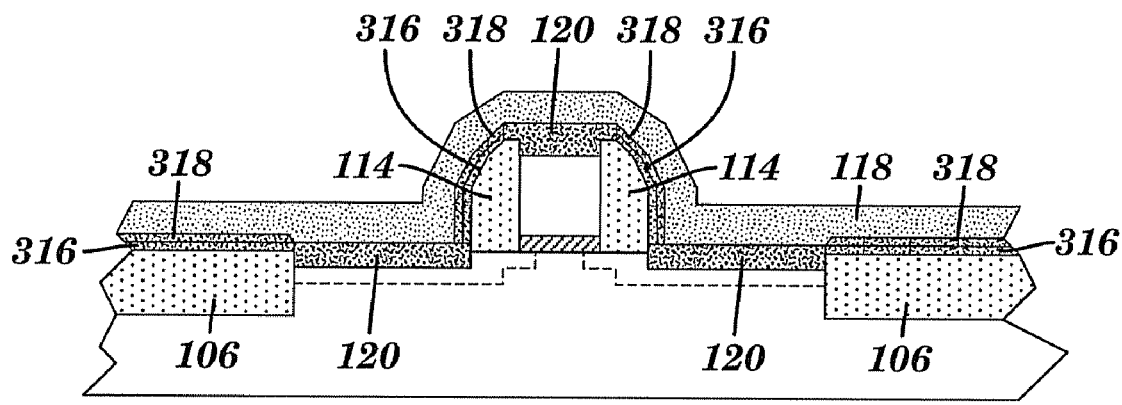
Figure 3E:
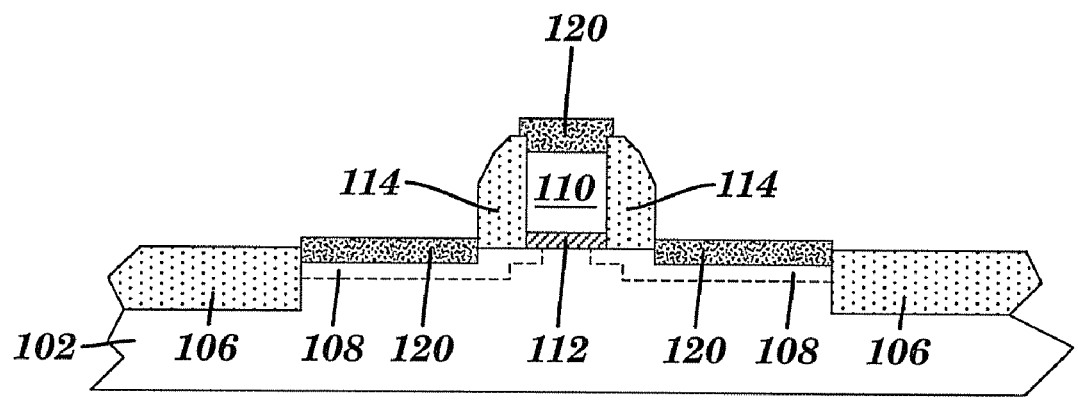

As shown in FIG. 3(d), the reaction of the nickel and nickel silicon layers over the source/drain regions 108 and gate conductor 110 form the NiSi contacts 120, while the portions of the $Ni_xSi_y$ layer 318 over the unreacted nickel layer areas are also converted to thin NiSi. However, during a subsequent etch process of the pure nickel, the NiSi formed over the spacers 114 and STIs 106 is undercut and removed as shown in FIG. 3(e). Thus, the use of the thin $Ni_xSi_y$ layer 318 over the nickel layer 316 reduces the tendency for gate-source and gate-drain bridging over the spacers 114, as well as promotes the formation of NiSi in the top part of the salicide contacts 120. As is the case with the first embodiment, the reduction of metal rich nickel phases provides resistance to dendrite formation upon additional thermal treatments during subsequent formation steps.

Figure 4A:
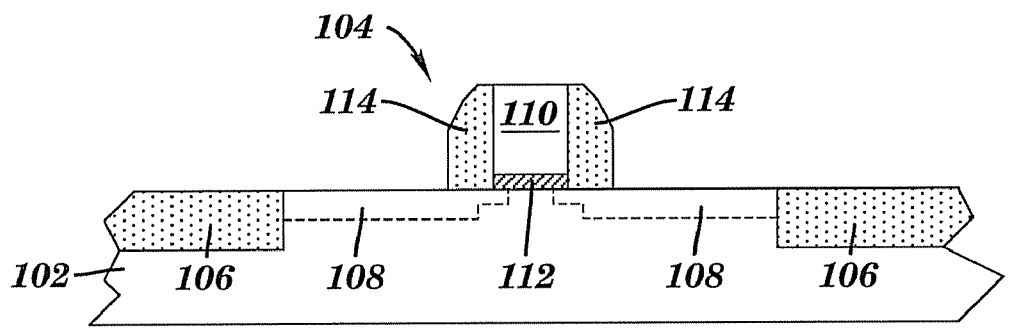
Figure 4B:
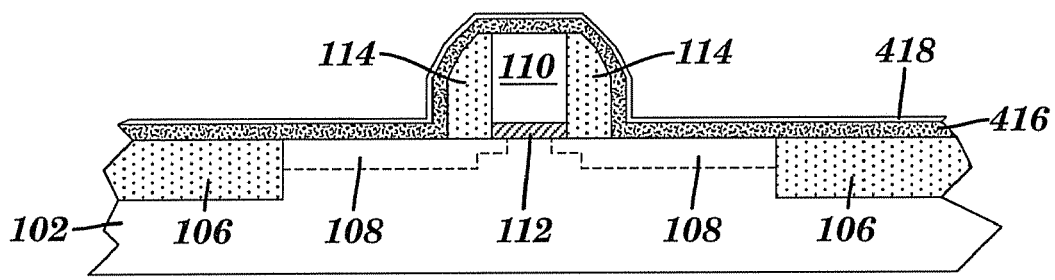
Figure 4C:
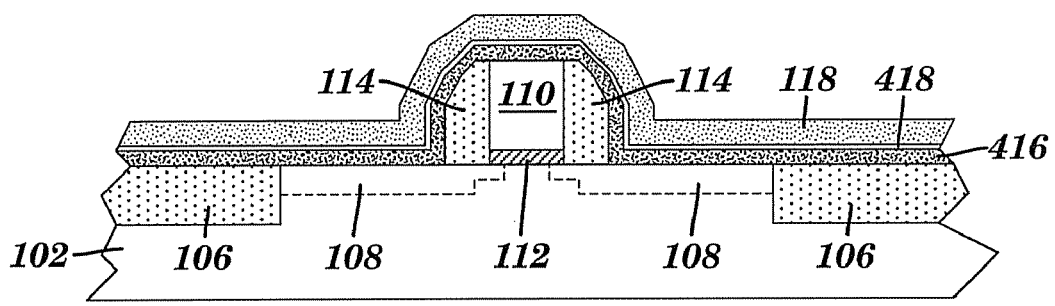
Figure 4E:
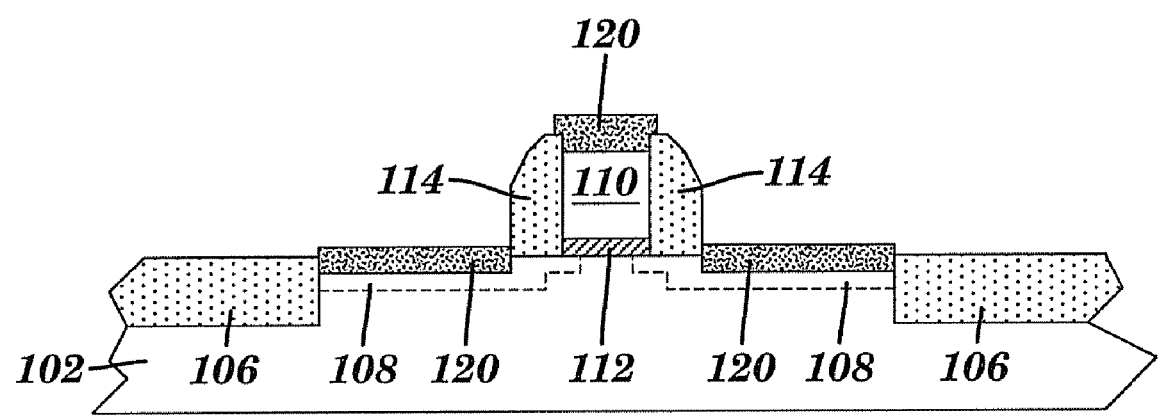

Finally, FIGS. 4(a) through 4(e) illustrate a third embodiment of a method for reducing dendrite formation in a nickel salicide process. After the exemplary FET structure is formed in FIG. 4(a), a nickel layer 416 is deposited over the semiconductor device, followed by a thin silicon layer 418. In an exemplary embodiment, the thickness of the nickel layer 416 may have about the same thickness as used in a conventional salicide process (e.g., about 6 to about 10 nm), while the thin silicon layer 418 may be on the order of about 1-10 angstroms in thickness to promote a further reaction of remaining metal rich portions in the subsequently reacted nickel layer 416. In FIG. 4(c), the cap layer 118 is formed over the silicon layer 418, followed by an anneal.

As shown in FIG. 4(d), the reaction of the nickel and silicon layers over the source/drain regions 108 and gate conductor 110 form the NiSi contacts 120, while the portions of the silicon layer 418 over the unreacted nickel layer areas are easily removable due to the undercutting of nickel during the silicide wet etch process. The salicide contacts 120, now more dendrite resistant, are prepared for further device processing. One advantage of this embodiment is the ability to independently control the ratio of silicon to nickel during deposition, as each layer is formed separately.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for reducing dendrite formation in a self-aligned, silicide process for a semiconductor device, the method comprising:

forming an initial metal silicon layer directly on exposed portions of a silicon containing substrate;

said initial metal silicon layer formed in a manner so as to reduce the concentration of metal rich portions thereof through the introduction of silicon thereto; and performing a single silicide anneal of said initial metal silicon layer so as to completely react the metal in said initial metal silicon layer over said exposed portions of said silicon containing substrate, thereby forming a silicide over said exposed portions of said silicon containing substrate;

wherein the single silicide anneal is performed on said initial metal silicon layer without also increasing the metal concentration of any portions of the initial metal silicon layer beforehand.

2. The method of claim 1, wherein said metal silicon layer further comprises a nickel silicon mixture deposited on said semiconductor substrate.

3. The method of claim 2, wherein said metal silicon layer is of the form $Ni_xSi_y$, having an atomic silicon concentration of about 5% to about 20%.

4. The method of claim 1, further comprising forming a capping layer over said metal silicon layer prior to said annealing the semiconductor device.

5. The method of claim 4, wherein said capping layer comprises titanium nitride.

6. The method of claim 5, wherein said capping layer is formed at a thickness of about 20 nanometers.

7. The method of claim 1, wherein said initial metal silicon layer is formed at an increased thickness with respect to a defined thickness for a substantially pure metal layer without silicon, wherein the increased thickness is greater than the defined thickness by about an amount equal to the percent of atomic silicon in said initial metal silicon layer.

* * * * *